(12) United States Patent
Takeda et al.

(10) Patent No.: US 9,784,813 B2
(45) Date of Patent: Oct. 10, 2017

(54) BATTERY CONTROL SYSTEM AND BATTERY CONTROL METHOD

(75) Inventors: Kenji Takeda, Mito (JP); Kouichi Yokoura, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 405 days.

(21) Appl. No.: 13/817,740

(22) PCT Filed: Nov. 29, 2011

(86) PCT No.: PCT/JP2011/077561
§ 371 (c)(1),
(2), (4) Date: Feb. 19, 2013

(87) PCT Pub. No.: WO2013/080304
PCT Pub. Date: Jun. 6, 2013

(65) Prior Publication Data
US 2014/0278180 A1    Sep. 18, 2014

(51) Int. Cl.
| | |
|---|---|
| G01P 21/00 | (2006.01) |
| G01R 35/00 | (2006.01) |
| G01R 31/36 | (2006.01) |
| H04Q 9/00 | (2006.01) |
| H01M 10/42 | (2006.01) |
| H01M 10/48 | (2006.01) |
| G01R 19/165 | (2006.01) |

(52) U.S. Cl.
CPC ......... *G01R 35/00* (2013.01); *G01R 31/3658* (2013.01); *H01M 10/425* (2013.01); *H01M 10/4207* (2013.01); *H01M 10/482* (2013.01); *H04Q 9/00* (2013.01); *G01R 19/16542* (2013.01); *G01R 31/362* (2013.01); *G01R 31/3689* (2013.01); *H01M 2010/4278* (2013.01); *H04Q 2209/845* (2013.01)

(58) Field of Classification Search
CPC .......... G01R 31/3658; G01R 19/16542; G01R 31/3679; G01R 31/3624; G01R 31/007; G01R 31/3648; G01R 35/00; G01R 19/10; G01R 31/3606; B60L 11/1861; B60L 2240/545; B60L 3/0046; B60L 11/1864; B60L 11/1877; G04F 10/00
See application file for complete search history.

(56) References Cited

U.S. PATENT DOCUMENTS

2007/0279953 A1*  12/2007  Hoff ...................... H01M 2/105
                                                                  363/87
2011/0204898 A1*   8/2011  Kim ................... G01R 19/2506
                                                                  324/434

FOREIGN PATENT DOCUMENTS

JP          2000-358330 A       12/2000

* cited by examiner

*Primary Examiner* — Elias Desta
(74) *Attorney, Agent, or Firm* — Crowell & Moring LLP (57) ABSTRACT

A relay (20) receives a battery information acquisition time from each battery module (10) and calculates measurement time differential information Δt, that is, a time difference between the battery information acquisition time as a reference and the battery information acquisition time of another battery module (10) among the received battery information acquisition times, for each battery module (10). A measurement time correction unit (115) of each battery module (10) corrects a measurement time by the measurement time differential information Δt, using the measurement time differential information Δt received from the relay (20) to adjust the battery information acquisition time of each battery module (10) to the same time.

9 Claims, 5 Drawing Sheets

BATTERY CONTROL SYSTEM AND BATTERY CONTROL METHOD

TECHNICAL FIELD

The present invention relates to a battery control system in which disposes control devices that control batteries as a hierarchical structure, and a battery control method.

BACKGROUND ART

Figure 5:
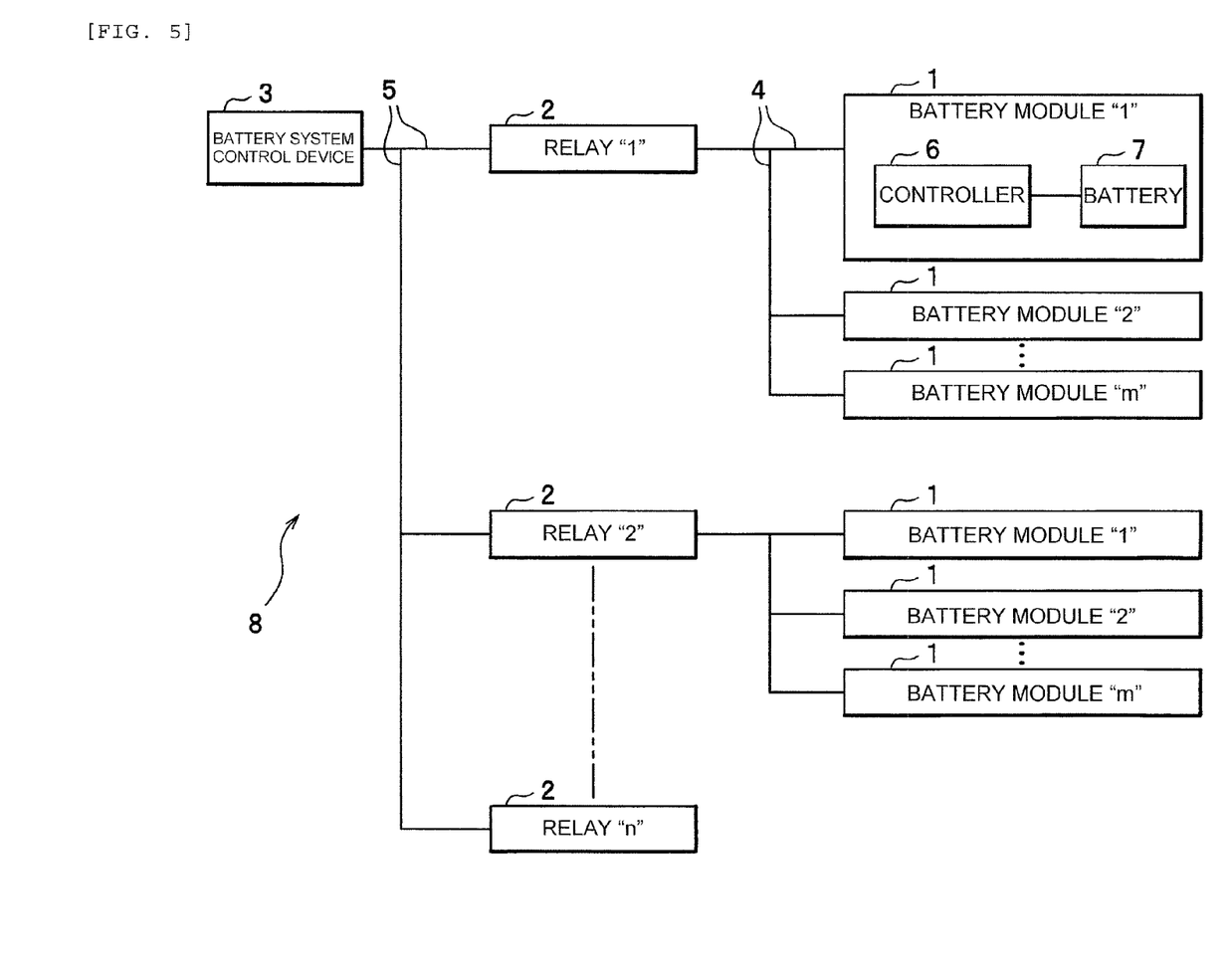
FIG. 5 is a diagram illustrating a configuration of a battery control system in the related art.

A technology of charging a battery with power generated by utilizing natural energy and with power from a system is getting attention. As shown in FIG. 5, a battery control system realized by such a technology includes battery modules 1 that have a controller 6 controlling a battery 7 and are connected in series or in parallel as a group and a single relay 2 that comprehensively controls this group of the battery modules 1. Moreover, a battery system control device 3 that manages the respective battery modules 1 as a whole through a group of a plurality of the relays 2 is provided and thus a large-capacity battery 7 is realized. As described above, in a battery control system 8 disposing control devices as a hierarchical structure, the battery system control device 3 transmits a control signal for instructing charging, discharging or the like of the battery 7 to each battery module 1 through the relay 2 and manages the status of communication lines 4 and 5 for transmitting and receiving the control signal and the operation status of the control device itself (refer to PTL 1).

CITATION LIST

Patent Literature

[PTL 1] JP-A-2000-358330

SUMMARY OF INVENTION

Technical Problem

In the battery control system 8 of the related art shown in FIG. 5, each battery module 1 measures battery information such as temperature information, voltage and SOC (State Of Charge) of the battery 7 in the battery module 1 based on a request from the battery system control device 3 and transmits the battery information to the battery system control device 3 through the relay 2. Then, the battery system control device 3 collects the battery information acquired from each relay 2 and displays the collected battery information. Therefore, charging and discharging of each battery module 1 is managed.

However, in the battery control system 8 of the related art, there is time difference between when instruction information requesting acquisition of battery information from the battery system control device 3 is transmitted, when each battery module 1 acquires the instruction information through the relay 2, and when each battery module 1 actually executes measurement to acquire the battery information. According to this, it is not possible for each battery module 1 to measure the battery information at the same time. That is to say, there is variation in the acquisition time of the battery information with respect to each battery module 1. In particular, the battery information such as the voltage and SOC of the battery 7 is changed over the operation time. Therefore, in the battery control system 8 which disposes the control devices as a hierarchical structure and in which the large-capacity battery 7 is realized, as assumed by the present invention, in order to accurately control charging and discharging of the battery 7, it is necessary to measure the battery information at the same time (at the same timing).

The reason why there is a difference in the acquisition times of the battery information is that since communication between the relay 2 and the battery module 1 that receive the instruction information requesting acquisition of the battery information from the battery system control device 3 is basically performed one-on-one through a communication line 4, the relay 2 cannot transmit measurement instruction information to each battery module 1 at the same time and thus there is a difference in the time when each battery module 1 receives the measurement instruction information of the battery information. In addition, in a case where the battery module 1 measures the battery information of the battery 7, there may be time difference between measurement instruction and acquisition of the battery information, depending on the type of the battery 7 (for example, a zinc battery, a nickel hydride battery, a lithium-ion battery, or the like). Moreover, even if the battery modules 1 include the same type of the battery 7, for example, when an old battery module 1 is exchanged with a new battery module 1 for maintenance, there may be a time difference between the measurement instruction and acquisition of the battery information in accordance with degradation of the battery 7 with the passage of operating time, or there may be time difference between measurement instruction and acquisition of the battery information depending on temperature of each battery module 1.

The present invention has been made in view of such circumstances, and an object thereof is to provide a battery control system and a battery control method in which each battery module acquires battery information at the same time even in a case where type or status of use of a battery is different, in the battery control system which disposes a battery system control device, a relay and a battery module as a hierarchical structure.

Moreover, the term "the same time" in the present invention includes a case where a difference (variation) in acquisition time of the battery information becomes less compared with the related art in addition to a case where each battery module acquires the battery information at exactly the same time, and means that each timing of the battery information acquisition is made to match.

Solution to Problem

To solve the above-described problem, a relay of a battery control system according to the present invention receives battery information acquisition time from each battery module and calculates measurement time differential information Δt, that is, a time difference between the battery information acquisition time as a reference and the battery information acquisition time of another battery module, among the received battery information acquisition times, for each battery module 10. A measurement time correction unit of each battery module corrects measurement time by the measurement time differential information Δt, using the measurement time differential information Δt received from the relay so as to adjust the battery information acquisition time of each battery module to the same time.

Advantageous Effects of Invention

According to the present invention, in a battery control system disposing a battery system control device, a relay and a battery module as a hierarchical structure, it is possible to provide the battery control system and a battery control method in which each battery module acquires battery information at the same time even in a case where type or status of use of a battery is different.

DESCRIPTION OF EMBODIMENTS

<Process Outline>

First, an outline of a process performed by a battery control system 80 according to an embodiment of the present invention (hereinafter, referred to as an "embodiment") will be described with reference to FIG. 1 and FIG. 2.

Figure 1:
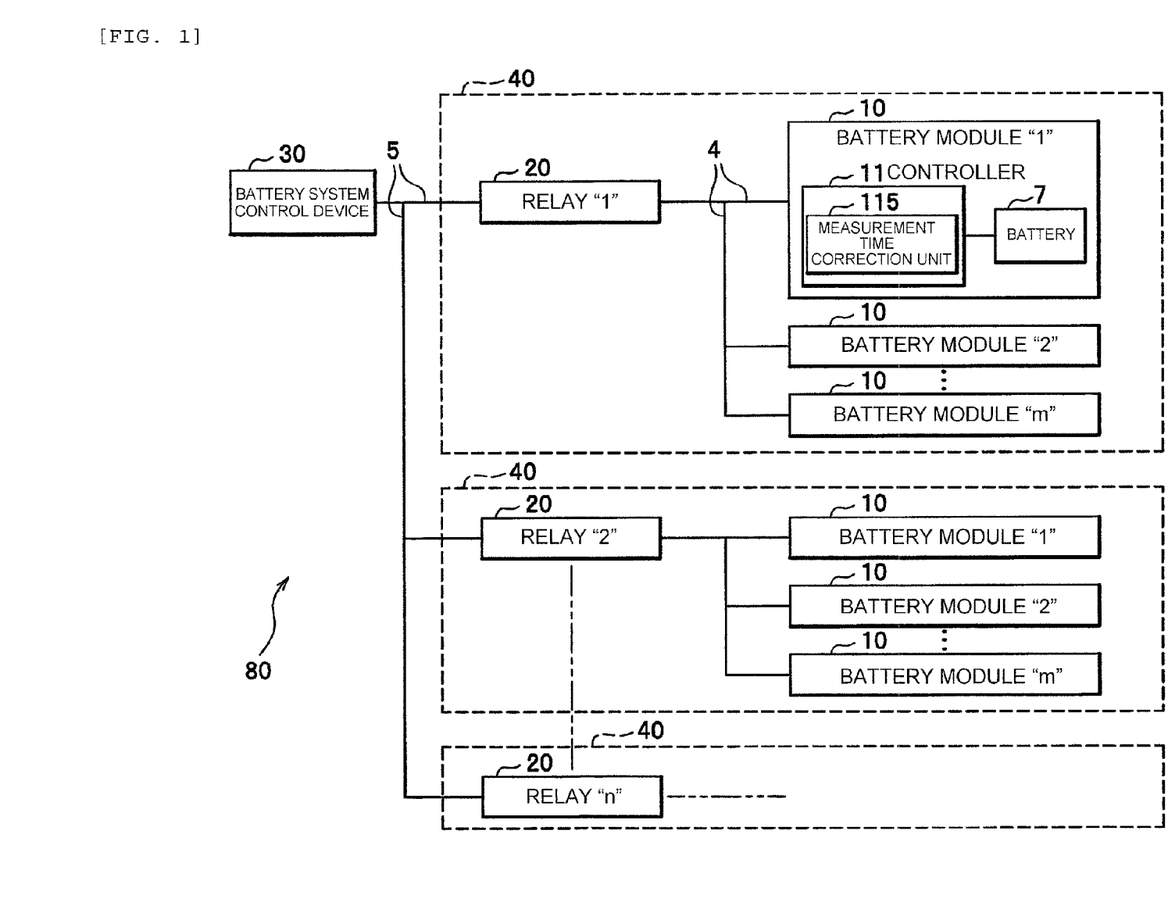
FIG. 1 is a diagram illustrating an overall configuration of a battery control system according to an embodiment of the present invention.

FIG. 1 is a diagram illustrating the overall configuration of the battery control system 80 according to the embodiment.

As shown in FIG. 1, the battery control system 80 according to the embodiment includes a plurality of battery modules 10 ("1", "2", . . . , "m") that have a controller 11 measuring battery information of a battery 7 and controlling charging and discharging of the battery 7, a plurality of relays 20 ("1", "2", . . . , "n") that are connected to the plurality of battery modules 10 through the communication line 4 and control the all of the plurality of battery modules 10 and a battery system control device 30 that is connected to the plurality of relays 20 through a communication line 5 and controls the whole battery control system 80. In addition, a set of one relay 20 and the plurality of battery modules 10 ("1", "2", . . . , "n") connected to the relay 20 is referred to as a battery pack 40. Moreover, the battery 7 may be a single cell battery or may be a plurality of cell batteries.

In comparison with the battery module 1 in the battery control system 8 of the related art shown in FIG. 5, the controller 11 of the battery module 10 according to the embodiment is provided with a measurement time correction unit 115 that corrects a measurement time of battery information, as a discriminative configuration thereof (details will be described later). In addition, the controller 11 acquires the battery information such as temperature information, a voltage and SOC of the battery 7 and then transmits the acquired battery information and a time when the battery information is acquired (battery information acquisition time) to the relay 20.

The relay 20 collects the battery information and the battery information acquisition time thereof, which are transmitted from each battery module 10, and transmits the battery information and the battery information acquisition time thereof as battery module collection information 230 (refer to FIG. 3 described later) to the battery system control device 30.

The battery system control device 30 acquires and collects each battery module collection information 230 transmitted from each relay 20. Then, the battery system control device 30 generates battery pack collection information 330 (refer to FIG. 3 described later) for which each respective battery module collection information 230 is collected, and displays the generated battery pack collection information 330 on a display unit 35 (refer to FIG. 3 described later) such as a display.

Figure 2:
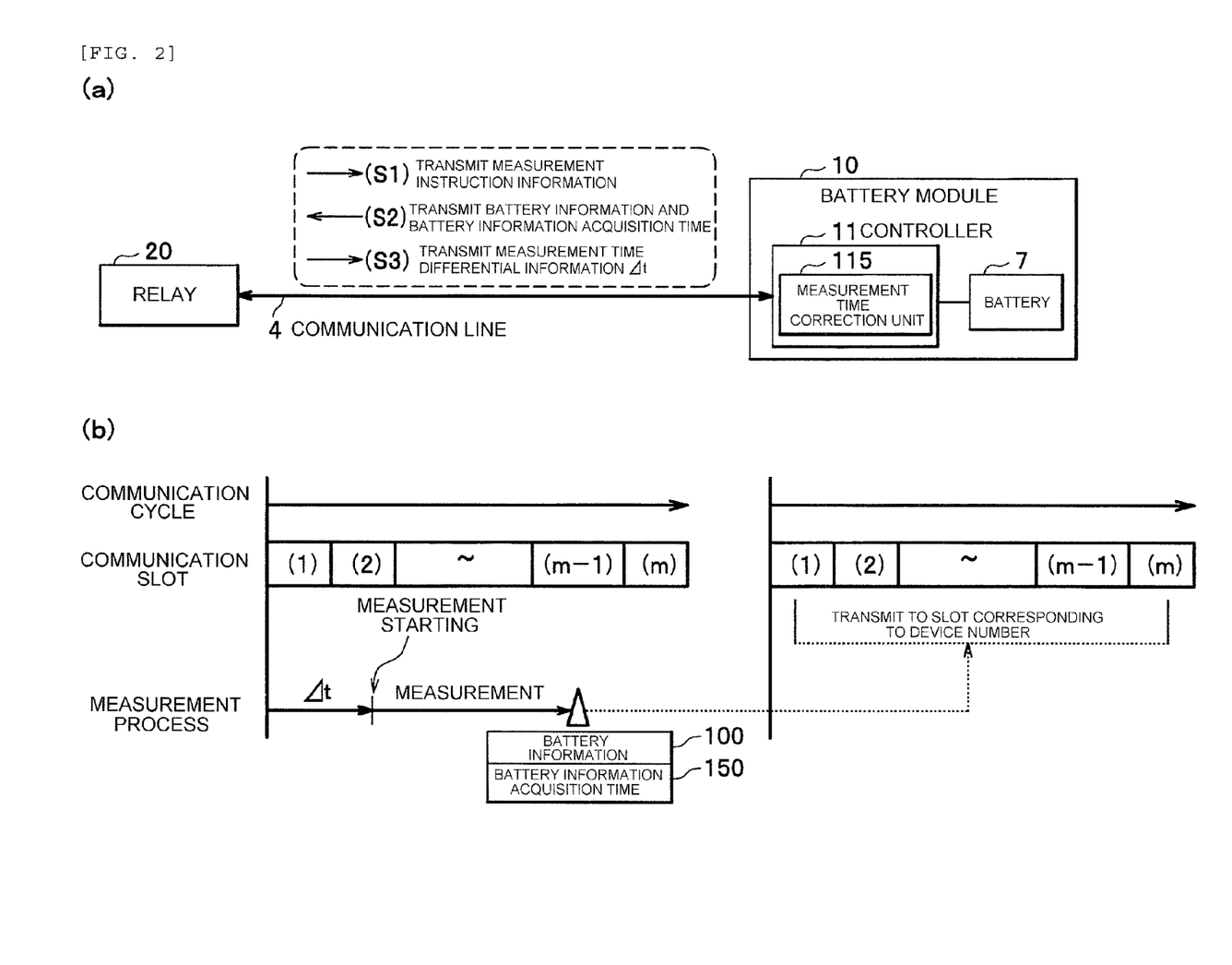
FIG. 2 is a diagram illustrating an acquisition process outline of battery information in the battery control system according to the embodiment of the present invention.

FIG. 2 is a diagram illustrating an acquisition process outline of battery information 100 by the battery control system 80 according to the embodiment. The battery module 10 according to the embodiment stores measurement time differential information $\Delta t$ that is transmitted from the relay 20 to each battery module 10. When the battery module 10 receives instruction information of measuring the battery information 100 (measurement instruction information) from the relay 20, the measurement time correction unit 115 delays measurement starting time by the measurement time differential information $\Delta t$ so as to start measuring. The measurement time differential information $\Delta t$ is information representing a time when, in order to acquire simultaneous battery information 100, each battery module 10 delays the measurement starting time so as to adjust the measurement starting time to the same time, that is, a time when each battery module 10 adjusts the timing of measurement.

FIG. 2($a$) is a diagram illustrating a process for determining the measurement time differential information $\Delta t$ between the relay 20 and the battery module 10. FIG. 2($b$) is a diagram illustrating a process in which the battery module 10 delays the measurement starting time by the measurement time differential information $\Delta t$ so as to acquire the battery information 100 and transmits the acquired information and a battery information acquisition time 150 thereof to the relay 20.

Further, in FIG. 2($a$), only one battery module 10 is shown and illustrated, but the same process as described below is performed in another battery module 10. Furthermore, in FIG. 2($a$), illustration of the battery system control device 30 is omitted.

First, the relay 20 receives instruction information (measurement instruction information) requesting acquisition of the battery information 100 from the battery system control device 30 and as shown in FIG. 2($a$), the relay 20 transmits the instruction information (measurement instruction information) to the battery module 10 positioned at a lower-level position than the relay 20 (Step S1).

Next, the battery module 10 receiving the measurement instruction information acquires the battery information 100 of the battery 7 in the battery module 10 and the battery information acquisition time 150 thereof in an acquisition process of the battery information 100 in an initial state, and transmits the battery information 100 and the battery information acquisition time 150 thereof to the relay 20 (Step S2). Here, the initial state means a state where the battery module 10 does not store the measurement time differential information $\Delta t$ and acquires the battery information 100 without an adjustment process of measurement starting time by a process of the measurement time correction unit 115.

Subsequently, the relay 20 generates the measurement time differential information $\Delta t$ corresponding to each battery module 10 and transmits the measurement time differential information $\Delta t$ to each battery module 10 (Step S3).

Specifically, when the relay 20 receives the battery information 100 and the battery information acquisition time 150 thereof from each battery module 10 ("1", "2", ..., "m"), the relay 20 detects the battery module 10 having the latest battery information acquisition time 150 and calculates the measurement time differential information Δt ($\Delta t_1$, $\Delta t_2$, ..., $\Delta t_m$), that is, a time difference between the latest battery information acquisition time 150 and another battery information acquisition time 150, in order to adjust another battery information acquisition time 150 to the timing of the latest battery information acquisition time 150. Then, the relay 20 transmits the measurement time differential information Δt ($\Delta t_1$, $\Delta t_2$, ..., $\Delta t_m$) corresponding to each battery module 10 ("1", "2", ..., "m") to each battery module 10.

The measurement time correction unit 115 of each battery module 10 ("1", "2", ..., "m") stores each received measurement time differential information Δt ($\Delta t_1$, $\Delta t_2$, ..., $\Delta t_m$) in a storage unit (not shown).

Next, an acquisition process of the battery information 100 of the battery module 10 in a state where the measurement time differential information Δt is stored in the storage unit of the battery module 10 will be described with reference to FIG. 2(b). Here, data is transmitted from the relay 20 in a TDM (Time Division Multiplexing) method.

First, the battery module 10 receives instruction information (measurement instruction information) requesting acquisition of the battery information 100 from the relay 20 through the communication line 4. Here, the measurement instruction information reaches a communication slot (1 to m) corresponding to each battery module 10.

The battery module 10, controlled by the measurement time correction unit 115, delays the measurement starting time from the beginning of a communication cycle by the measurement time differential information Δt stored in the storage unit of the battery module 10 so as to start measuring. When the measurement is finished, the battery module 10 acquires the battery information 100 and the time when the battery information 100 is acquired is set as the battery information acquisition time 150. Further, as described above, the measurement time of the battery information 100 may be different, depending on the status of use, such as the type or temperature of the battery 7 and a degradation degree of the battery 7.

Then, the battery module 10 transmits the acquired battery information 100 and the battery information acquisition time 150 thereof to the relay 20, using communication slot (1 to m) corresponding to each battery module 10 in the next cycle.

In this way, each battery module 10 delays the measurement starting time by the measurement time differential information Δt ($\Delta t_1$, $\Delta t_2$, ..., $\Delta t_m$) corresponding to each battery module 10 ("1", "2", ..., "m"). Therefore, it is possible to acquire the battery information 100 of the same time.

<System Configuration>

Next, each configuration of the battery module 10, the relay 20 and the battery system control device 30 configuring the battery control system 80 according to the embodiment will be described in detail.

Figure 3:
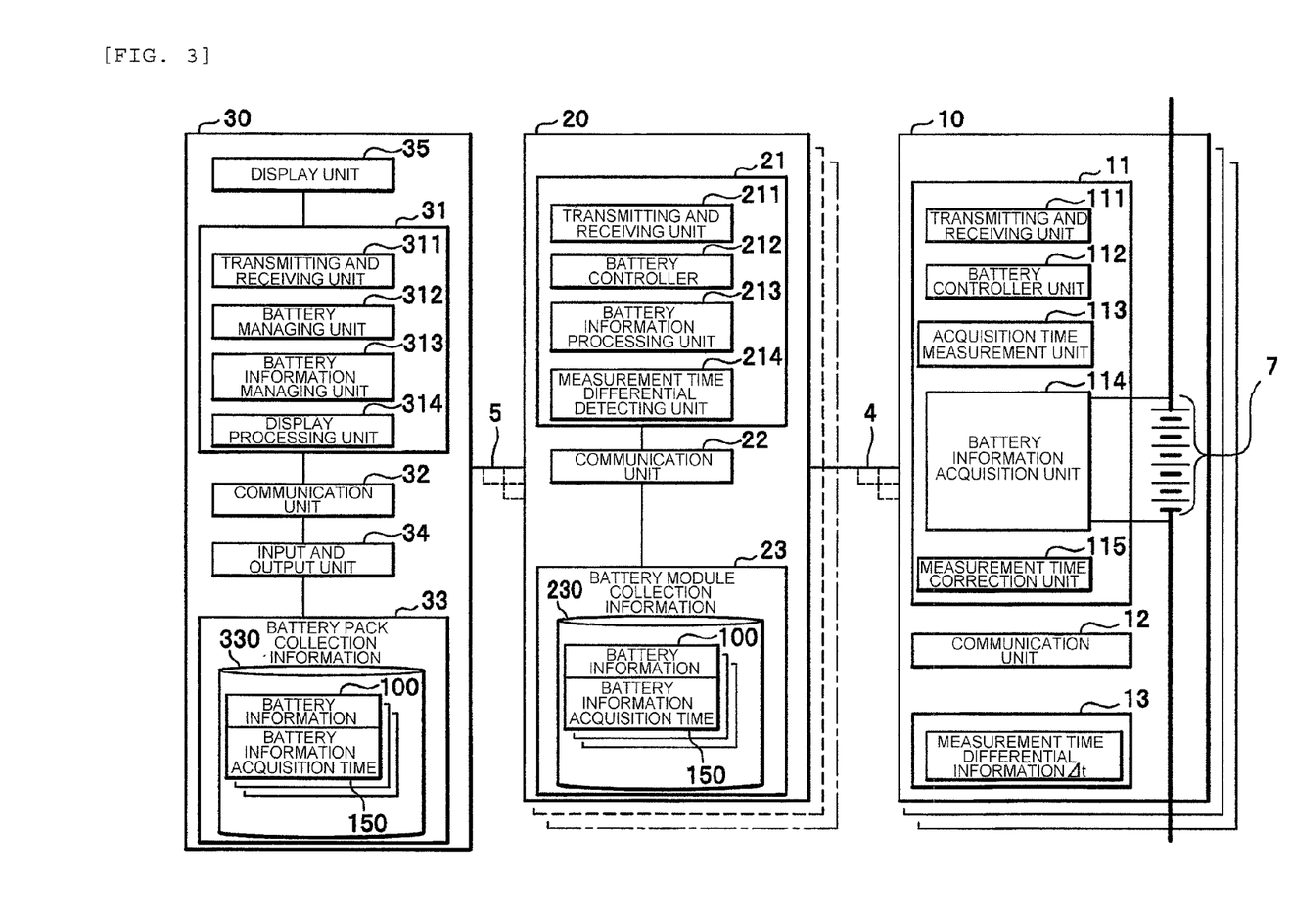
FIG. 3 is a functional block diagram showing configuration examples of a battery module, a relay and a battery system control device in the battery control system according to the embodiment of the present invention.

FIG. 3 is a functional block diagram showing configuration examples of the battery module 10, the relay 20 and the battery system control device 30 in the battery control system 80 according to the embodiment.

<<Battery Module>>

First, the configuration of the battery module 10 according to the embodiment will be described in detail.

As shown in FIG. 3, the battery module 10 includes the controller 11, a communication unit 12 and a storage unit 13.

The controller 11 manages an overall process of, for example, measurement of the battery information 100 of the battery 7, control of charging and discharging of the battery 7, or the like, and includes a transmitting and receiving unit 111, a battery controller unit 112, an acquisition time measurement unit 113, a battery information acquisition unit 114 and the measurement time correction unit 115.

The transmitting and receiving unit 111 controls transmission and reception of information with the relay 20 through the communication unit 12.

The battery controller unit 112 receives a control signal of the battery 7 from the battery system control device 30 through the relay 20 and controls charging and discharging of the battery 7 connected to the battery controller unit 112.

The acquisition time measurement unit 113 measures the time when the battery information acquisition unit 114 acquires the battery information 100 such as temperature information, a voltage and SOC and transmits the measured battery information acquisition time 150 to the battery information acquisition unit 114.

The battery information acquisition unit 114 receives the measurement instruction information of the battery information 100 from the relay 20 and acquires the battery information 100 of the battery 7. At this time, when an instruction to delay the starting of the measurement by the measurement time differential information Δt is received from the measurement time correction unit 115, the battery information acquisition unit 114 delays the starting of the measurement by the measurement time differential information Δt so as to start acquiring the battery information 100.

In addition, the battery information acquisition unit 114 receives the battery information acquisition time 150, that is, the time when the battery information 100 is acquired, from the acquisition time measurement unit 113 and transmits the battery information 100 and the battery information acquisition time 150 thereof to the relay 20 through the communication unit 12.

The measurement time correction unit 115 receives the measurement time differential information Δt from the relay 20 and stores the received measurement time differential information Δt in the storage unit 13. When the battery information acquisition unit 114 receives the measurement instruction information of the battery information 100, the measurement time correction unit 115 instructs the battery information acquisition unit 114 to delay the starting of the measurement of the battery information 100 by the measurement time differential information Δt stored in the storage unit 13.

The communication unit 12 includes a communication interface for transmitting and receiving information with the relay 20.

The storage unit 13 includes storage means such as a flash memory or a RAM (Random Access Memory) and stores the above-described measurement time differential information Δt or the like.

Moreover, the function of the controller 11 is realized by, for example, a program execution process performed by a CPU (Central Processing Unit) included in the battery module 10, a dedicated circuit or the like. When the function of the battery module 10 is realized by the program execution process, a program read and executed by the CPU is stored in the storage unit 13.

<<Relay>>

Next, the configuration of the relay 20 according to the embodiment will be described in detail.

As shown in FIG. 3, the relay 20 includes a controller 21, a communication unit 22 and a storage unit 23.

The controller 21 manages the control of the entire relay 20 and includes a transmitting and receiving unit 211, a battery controller 212, a battery information processing unit 213 and a measurement time differential detecting unit 214.

The transmitting and receiving unit 211 controls transmission and reception of information with the battery system control device 30 and each battery module 10 ("1", "2", . . . , "m") through the communication unit 22.

The battery controller 212 transmits the control signal related to charging and discharging of the battery 7 received from the battery system control device 30 to each battery module 10 connected to the relay 20.

The battery information processing unit 213 receives the instruction information (measurement instruction information) requesting acquisition of the battery information 100, from the battery system control device 30. Thereafter, the battery information processing unit 213 transmits the measurement instruction information to each battery module 10 connected to the relay 20.

Further, the battery information processing unit 213 collects the battery information 100 and the battery information acquisition time 150 thereof that are received from each battery module 10 and stores the battery information 100 and the battery information acquisition time 150 thereof as the battery module collection information 230 in the storage unit 23. Thereafter, the battery information processing unit 213 transmits the battery module collection information 230 to the battery system control device 30.

Furthermore, the battery information processing unit 213 transmits the battery information acquisition time 150 received from each battery module 10 to the measurement time differential detecting unit 214.

When the measurement time differential detecting unit 214 acquires the battery information acquisition time 150 from each battery module 10 ("1", "2", . . . , "m") through the battery information processing unit 213, the measurement time differential detecting unit 214 detects the battery module 10 having the latest battery information acquisition time 150 and calculates the measurement time differential information $\Delta t$ ($\Delta t_1$, $\Delta t_2$, . . . , $\Delta t_m$), that is, the time difference between the detected latest battery information acquisition time 150 and the battery information acquisition time 150 of another battery module 10 for each battery module 10, in order to adjust another battery information acquisition time 150 to the timing of the latest battery information acquisition time 150.

Then, the measurement time differential detecting unit 214 transmits the measurement time differential information $\Delta t$ ($\Delta t_1$, $\Delta t_2$, . . . , $\Delta t_m$) corresponding to each battery module 10 ("1", "2", . . . , "m") to each battery module 10.

Whenever the relay 20 receives the battery information 100 and the battery information acquisition time 150 thereof from each battery module 10, the measurement time differential detecting unit 214 may generate new measurement time differential information $\Delta t$ ($\Delta t_1$, $\Delta t_2$, . . . , $\Delta t_m$) and transmit the new measurement time differential information $\Delta t$ to each battery module 10.

In addition, the measurement time differential detecting unit 214 stores the measurement time differential information $\Delta t$ ($\Delta t_1$, $\Delta t_2$, . . . , $\Delta t_m$) in the storage unit 23 and a predetermined threshold value is provided for a changing range of the measurement time differential information $\Delta t$. According to this, the value of the newly generated measurement time differential information $\Delta t$ is compared to the value of the stored measurement time differential information $\Delta t$. When the changing range of the measurement time differential information $\Delta t$ exceeds the predetermined threshold value, the measurement time differential detecting unit 214 may transmit the new measurement time differential information $\Delta t$ to each battery module 10. When the changing range of the measurement time differential information $\Delta t$ is within the predetermined threshold value, the measurement time differential detecting unit 214 may not transmit the measurement time differential information $\Delta t$ to each battery module 10.

Moreover, in the measurement time correction unit 115 of the battery module 10 side, a predetermined threshold value is provided for the changing range of the measurement time differential information $\Delta t$. When the received new measurement time differential information $\Delta t$ exceeds the predetermined threshold value, the measurement time differential detecting unit 214 may update the measurement time differential information $\Delta t$ stored in the storage unit 13.

The communication unit 22 includes a communication interface for transmitting and receiving information with each battery module 10 and the battery system control device 30.

The storage unit 23 includes storage means such as a flash memory or a RAM and stores the above-described battery module collection information 230 or the like.

Moreover, the function of the controller 21 is realized by, for example, a program execution process performed by a CPU included in the relay 20, a dedicated circuit or the like. When the function of the relay 20 is realized by the program execution process, a program read and executed by the CPU is stored in the storage unit 23.

<<Battery System Control Device>>

Next, the configuration of the battery system control device 30 will be described in detail.

As shown in FIG. 3, the battery system control device 30 includes a controller 31, a communication unit 32, a storage unit 33, an input and output unit 34 and the display unit 35.

The controller 31 manages the control of the entire battery system control device 30 and includes a transmitting and receiving unit 311, a battery managing unit 312, a battery information managing unit 313 and a display processing unit 314.

The transmitting and receiving unit 311 controls transmission and reception of information with each relay 20 through the communication unit 32.

The battery managing unit 312 determines the control of charging, discharging or the like of the battery 7 included in each battery module 10, based on the battery pack collection information 330 or the like that is stored in the storage unit 33 and described later, and includes the battery information 100 and the battery information acquisition time 150 thereof. Then, the battery managing unit 312 transmits the control signal for controlling the charging, discharging or the like to the relay 20.

The battery information managing unit 313 transmits the instruction information (measurement instruction information) requesting acquisition of the battery information 100 to each relay 20 for each predetermined interval. Then, the battery information managing unit 313 receives the battery module collection information 230 from each relay 20, collects the received battery module collection information 230, and generates the battery pack collection information 330. Then, the battery information managing unit 313 stores the generated battery pack collection information 330 in the storage unit 33.

The display processing unit 314 performs the control of displaying the battery pack collection information 330 stored in the storage unit 33 and including the battery information 100 and the battery information acquisition time 150 thereof on the display unit 35.

The communication unit 32 includes a communication interface for transmitting and receiving information with each relay 20.

The storage unit 33 includes storage means such as a hard disk, a flash memory or a RAM and stores the above-described battery pack collection information 330 or the like.

The input and output unit 34 includes an input and output interface for exchanging information with an input device (not shown) such as a keyboard or a mouse and an output device (not shown) such as a printer.

In addition, the display unit 35 includes display means such as a display.

Moreover, the function of the controller 31 is realized by, for example, a program execution process performed by a CPU included in the battery system control device 30, a dedicated circuit or the like. When the function of the battery system control device 30 is realized by the program execution process, a program read and executed by the CPU is stored in the storage unit 33.

<Process Detail>

Next, the overall flow of a battery information acquisition process performed by the battery control system 80 according to the embodiment will be described in detail.

Figure 4:
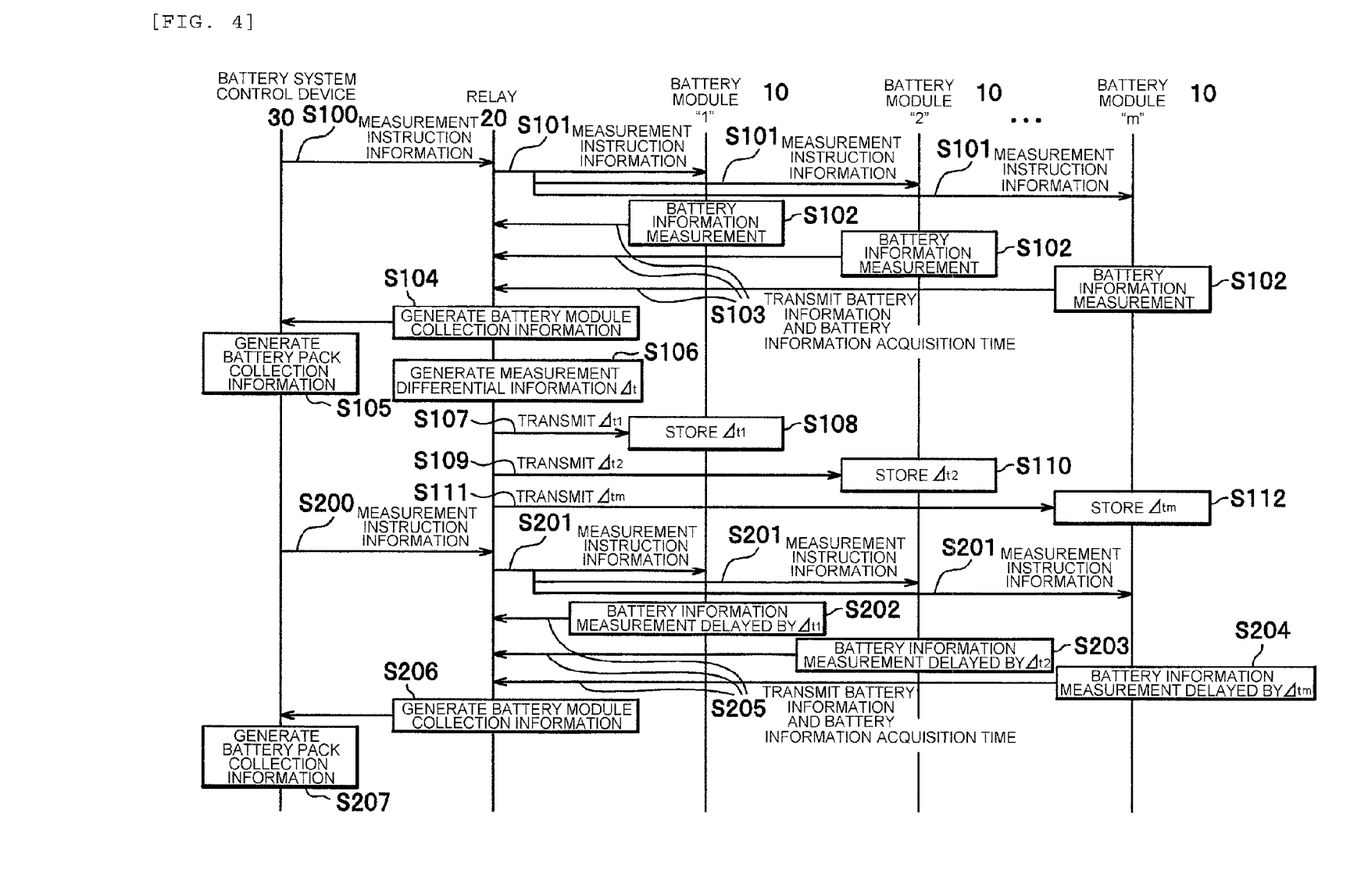
FIG. 4 is a sequence diagram showing the overall flow of a battery information acquisition process performed by the battery control system according to the embodiment of the present invention.

FIG. 4 is a sequence diagram showing the overall flow of the battery information acquisition process performed by the battery control system 80 according to the embodiment. Further, in FIG. 4, only one relay 20 is described and the description of another relay 20 is omitted. However, each relay 20 performs the same process as described below.

First, the battery information managing unit 313 of the battery system control device 30 transmits the instruction information (measurement instruction information) requesting acquisition of the battery information 100 to each relay 20 (Step S100).

Next, the battery information processing unit 213 of the relay 20 that receives the measurement instruction information from the battery system control device 30 transmits the measurement instruction information to each battery module 10 ("1", "2", . . . , "m") (Step S101).

The battery information acquisition unit 114 of each battery module 10 receiving the measurement instruction information measures temperature information, a voltage, SOC or the like of the battery 7 to acquire the battery information 100 (Step S102). Then, the battery information acquisition unit 114 receives the battery information acquisition time 150, that is, the time when the battery information 100 is acquired, from the acquisition time measurement unit 113. Subsequently, the battery information acquisition unit 114 of each battery module 10 transmits the battery information 100 and the battery information acquisition time 150 thereof to the relay 20 (Step S103).

Next, the battery information processing unit 213 of the relay 20 collects the battery information 100 and the battery information acquisition time 150 thereof that are received from each battery module 10, generates the battery module collection information 230 (Step S104) and transmits the generated battery module collection information 230 to the battery system control device 30. Then, the battery information managing unit 313 of the battery system control device 30 collects the battery module collection information 230 received from each relay 20, generates the battery pack collection information 330 (Step S105) and displays the generated battery pack collection information 330 on the display unit 35.

On the other hand, the measurement time differential detecting unit 214 of the relay 20 detects the battery module 10 having the latest battery information acquisition time 150, based on the battery information acquisition time 150 acquired by the battery information processing unit 213 and generates the measurement time differential information $\Delta t$ ($\Delta t_1, \Delta t_2, \ldots, \Delta t_m$), that is, the time difference between the detected latest battery information acquisition time 150 and the battery information acquisition time 150 of another battery module 10 for each battery module 10, in order to adjust another battery information acquisition time 150 to the timing of the latest battery information acquisition time 150 (Step S106).

Then, the measurement time differential detecting unit 214 of the relay 20 transmits the measurement time differential information $\Delta t_1$ to the battery module 10 ("1") (Step S107) and the measurement time correction unit 115 of the battery module 10 ("1") stores the received measurement time differential information $\Delta t_1$ in the storage unit 13 (Step S108).

In a similar way, the measurement time differential detecting unit 214 of the relay 20 transmits the measurement time differential information $\Delta t_2$ to the battery module 10 ("2") (Step S109) and the measurement time correction unit 115 of the battery module 10 ("2") stores the received measurement time differential information $\Delta t_2$ in the storage unit 13 (Step S110).

As described above, the measurement time differential detecting unit 214 of the relay 20 transmits the measurement time differential information $\Delta t_m$ to the battery module 10 ("m") (Step S111) and the measurement time correction unit 115 of the battery module 10 ("m") stores the received measurement time differential information $\Delta t_m$ in the storage unit 13 (Step S112).

In addition, the Steps S100 to S112 are the above-described acquisition process of the battery information 100 in the initial state.

Next, the battery information managing unit 313 of the battery system control device 30 transmits the next measurement instruction information to each relay 20 from the transmission of the measurement instruction information in Step S100 after a predetermined interval (Step S200).

Subsequently, the battery information processing unit 213 of the relay 20 receiving the measurement instruction information from the battery system control device 30 transmits the measurement instruction information to each battery module 10 ("1", "2", . . . , "m") (Step S201).

Then, the battery information acquisition unit 114 of the battery module 10 ("1") receiving the measurement instruction information delays the measurement starting time by the measurement time differential information $\Delta t_1$, based on the instruction from the measurement time correction unit 115 and then starts the measurement of the battery information 100, thereby acquiring the battery information 100 (Step S202). Further, the battery information acquisition unit 114 of the battery module 10 ("2") delays the measurement starting time by the measurement time differential information $\Delta t_2$, based on the instruction from the measurement time correction unit 115 and then starts the measurement of the battery information 100, thereby acquiring the battery information 100 (Step S203). As described above, the battery information acquisition unit 114 of the battery module 10 ("m") delays the measurement starting time by the measurement time differential information $\Delta t_m$, based on the instruction from the measurement time correction unit 115 and then starts the measurement of the battery information 100, thereby acquiring the battery information 100 (Step S204).

Then, the battery information acquisition unit 114 of each battery module 10 receives the battery information acquisition time 150, that is, the time when the battery information 100 is acquired, from each acquisition time measurement unit 113 and transmits the battery information 100 and the battery information acquisition time 150 thereof to the relay 20 (Step S205).

Next, the battery information processing unit 213 of the relay 20 collects the battery information 100 and the battery information acquisition time 150 thereof that are received from each battery module 10, generates the battery module collection information 230 (Step S206) and transmits the generated battery module collection information 230 to the battery system control device 30. Then, the battery information managing unit 313 of the battery system control device 30 collects the battery module collection information 230 received from each relay 20, generates the battery pack collection information 330 (Step S207) and displays the generated battery pack collection information 330 on the display unit 35.

Further, after Step S206, the measurement time differential detecting unit 214 of the relay 20 generates new measurement time differential information $\Delta t$ ($\Delta t_1, \Delta t_2, \ldots, \Delta t_m$) and transmits the new measurement time differential information $\Delta t$ to each battery module 10. Therefore, the measurement time correction unit 115 of each battery module 10 may update the measurement time differential information $\Delta t$ in the storage unit 13. Furthermore, in such a case, in the measurement time correction unit 115 of the battery module 10 side, a predetermined threshold value is provided for a changing range of the measurement time differential information $\Delta t$. When the received new measurement time differential information $\Delta t$ exceeds the predetermined threshold value, the measurement time correction unit 115 of each battery module 10 may update the measurement time differential information $\Delta t$ stored in the storage unit 13.

In addition, the measurement time differential detecting unit 214 stores the measurement time differential information $\Delta t$ ($\Delta t_1, \Delta t_2, \ldots, \Delta t_m$) in the storage unit 23 and a predetermined threshold value is provided for a changing range of the measurement time differential information $\Delta t$. According to this, the value of the newly generated measurement time differential information $\Delta t$ is compared to the value of the stored measurement time differential information $\Delta t$. When the changing range of the measurement time differential information $\Delta t$ exceeds the predetermined threshold value, the measurement time differential detecting unit 214 may transmit the new measurement time differential information $\Delta t$ to each battery module 10, thereby updating the measurement time differential information $\Delta t$.

In this way, according to the battery control system 80 and the battery control method of the embodiment, even in a case where type or status of use of the battery 7 is different, the measurement time correction unit 115 of the each battery module 10 corrects the measurement starting time. According to this, the battery information acquisition time 150 of the battery module 10 may be adjusted to the same time. Therefore, according to the battery control system 80 and the battery control method of the embodiment, even in a case where type or status of use of the battery 7 is different, the control of charging and discharging of the battery 7 may be more accurately performed.

Modified Example

Next, a modified example of the battery control system 80 and the battery control method according to the embodiment will be described.

As described above, whenever the battery information acquisition unit 114 of the battery module 10 according to the embodiment receives the instruction information (measurement instruction information) requesting acquisition of the battery information 100 from the battery system control device 30 through the relay 20, the battery information acquisition unit 114 of the battery module 10 performs the measurement of the battery information 100 of the battery 7. Then, the measurement time differential detecting unit 214 of the relay 20 detects the battery module 10 having the latest battery information acquisition time 150 among the battery information acquisition times 150 acquired from each battery module 10. In order to adjust another battery information acquisition time 150 to the timing of the latest battery information acquisition time 150, the measurement time differential detecting unit 214 of the relay 20 calculates the measurement time differential information $\Delta t$ ($\Delta t_1, \Delta t_2, \ldots, \Delta t_m$), that is, the time difference between the detected latest battery information acquisition time 150 and the battery information acquisition time 150 of another battery module 10 for each battery module 10. Thereafter, using the measurement time differential information $\Delta t$ received from the relay 20, the measurement time correction unit 115 of each battery module 10 delays the measurement starting time by the measurement time differential information $\Delta t$ ($\Delta t_1, \Delta t_2, \ldots, \Delta t_m$). According to this, the measurement time correction unit 115 of each battery module 10 corrects the battery information acquisition time 150 of each battery module 10 to be the same time.

On the other hand, in the battery module 10 according to the modified example of the embodiment, the battery information acquisition unit 114 normally (high-speedily) measures the battery information 100 such as temperature information, a voltage and SOC. In this case, the measurement time differential detecting unit 214 of the relay 20 according to the modified example of the embodiment detects the battery module 10 having the earliest battery information acquisition time 150 among the battery information acquisition times 150 acquired from each battery module 10 in the acquisition process of the battery information 100 in the initial state. In order to adjust another battery information acquisition time 150 to the timing of the earliest battery information acquisition time 150, the measurement time differential detecting unit 214 of the relay 20 calculates measurement time differential information $\Delta t'$ ($\Delta t_1', \Delta t_2', \ldots, \Delta t_m'$), that is, a time difference between the detected earliest battery information acquisition time 150 and the battery information acquisition time 150 of another battery module 10 for each battery module 10. Then, using the measurement time differential information $\Delta t'$ received from the relay 20, the measurement time correction unit 115 of each battery module 10 corrects the battery information acquisition time 150 of each battery module 10 by the measurement time differential information $\Delta t'$ ($\Delta t_1', \Delta t_2', \ldots, \Delta t_m'$) such that the battery information acquisition unit 114 acquires the battery information 100 which is measured before the measurement instruction information is received. According to this, the battery module 10 may acquire the battery information 100 of which the battery information acquisition time 150 of each battery module 10 is adjusted to the timing of the earliest battery information acquisition time 150 among the measured battery information 100 so as to be the same time.

REFERENCE SIGNS LIST 4, 5 COMMUNICATION LINE
7 BATTERY
8 BATTERY CONTROL SYSTEM
10 BATTERY MODULE
11, 21, 31 CONTROLLER
12, 22, 32 COMMUNICATION UNIT
13, 23, 33 STORAGE UNIT
20 RELAY
30 BATTERY SYSTEM CONTROL DEVICE
34 INPUT AND OUTPUT UNIT
35 DISPLAY UNIT
40 BATTERY PACK
80 BATTERY CONTROL SYSTEM
100 BATTERY INFORMATION
111, 211, 311 TRANSMITTING AND RECEIVING UNIT
112 BATTERY CONTROLLER UNIT
113 ACQUISITION TIME MEASUREMENT UNIT
114 BATTERY INFORMATION ACQUISITION UNIT
115 MEASUREMENT TIME CORRECTION UNIT
150 BATTERY INFORMATION ACQUISITION TIME
212 BATTERY CONTROLLER
213 BATTERY INFORMATION PROCESSING UNIT
214 MEASUREMENT TIME DIFFERENTIAL DETECTING UNIT
230 BATTERY MODULE COLLECTION INFORMATION
312 BATTERY MANAGING UNIT
313 BATTERY INFORMATION MANAGING UNIT
314 DISPLAY PROCESSING UNIT
330 BATTERY PACK COLLECTION INFORMATION

The invention claimed is:

1. A battery control system comprising:
a plurality of battery modules, each battery module configured to acquire battery information of a battery respective to that battery module including at least a voltage of the battery; and
a relay connected to each of the plurality of battery modules via one or more communication lines and the relay configured to control the plurality of battery modules connected to the relay,
wherein the relay includes:
a battery information processing unit that: (i) receives, from a control device, measurement instruction information requesting acquisition of the battery information and transmits the measurement instruction information to each battery module connected to the relay, and (ii) receives the battery information and a battery information acquisition time from each battery module, wherein the battery information acquisition time is a measurement of time from a measurement starting time for acquiring the battery information to when the battery information is acquired by the battery module from the battery respective to that battery module, and
a measurement time differential detecting unit that: (i) acquires the battery information acquisition time for each battery module via the battery information processing unit, (ii) determines a reference battery information acquisition time, wherein the reference battery information acquisition time is the battery information acquisition time that is latest among all received battery information acquisition times, (iii) calculates measurement time differential information ($\Delta t$), wherein the measurement time differential information ($\Delta t$) includes, for each battery module other than the battery module associated with the reference battery information acquisition time, a time difference value between the reference battery information acquisition time and the battery information acquisition time of the respective battery module, and (iv) transmits the calculated measurement time differential information ($\Delta t$) associated with each battery module to each respective battery module, and
wherein each of the plurality of the battery modules includes:
an acquisition time measurement unit that measures the battery information acquisition time for the battery module to acquire the battery information from the battery,
a battery information acquisition unit that: (i) measures and acquires the battery information of the battery when the measurement instruction information is received from the relay, (ii) acquires the battery information acquisition time from the acquisition time measurement unit, and (iii) transmits the battery information and the battery information acquisition time to the relay, and
a measurement time correction unit that (i) receives the measurement time differential information ($\Delta t$) from the relay, (ii) store the received measurement time differential information ($\Delta t$) in a storage unit, and (iii) when the battery information acquisition unit receives the measurement instruction information, corrects the measurement starting time for measuring the battery information by delaying the measurement starting time by the measurement time differential information ($\Delta t$) stored in the storage unit so that each of the plurality of the battery modules acquires the respective battery information at a same time.

2. The battery control system according to claim 1,
wherein the relay includes a storage unit in which the measurement time differential information ($\Delta t$) calculated by the measurement differential detecting unit for each battery module is stored,
wherein the measurement differential detecting unit (i) calculates new measurement time differential information ($\Delta t$) when a new battery information acquisition time transmitted from each battery module as a response to a new measurement instruction information by the battery information processing unit, (ii) compares a new measurement time differential information ($\Delta t$) with the measurement time differential information ($\Delta t$) stored in the storage unit of the relay, and transmits the new measurement time differential information ($\Delta t$) to each battery module when the time difference value exceeds a predetermined threshold value, and
wherein the measurement time correction unit of the battery module updates the measurement time differential information ($\Delta t$) stored in the storage unit of the measurement time correction unit using the new measurement time differential information ($\Delta t$).

3. The battery control system according to claim 1,
wherein the measurement time differential detecting unit of the relay calculates new measurement time differential information ($\Delta t$) with respect to a new battery information acquisition time transmitted from each battery module as a response to a new measurement instruction information by the battery information processing unit, and transmits the calculated new measurement time differential information ($\Delta t$) to each battery module, and wherein the measurement time correction unit of the battery module compares the received new measurement time differential information ($\Delta t$) with the measurement time differential information ($\Delta t$) stored in the storage unit of the measurement time correction unit, and when the time difference value exceeds a predetermined threshold value, updates the measurement time differential information ($\Delta t$) stored in the storage unit of the measurement time correction unit using the new measurement time differential information ($\Delta t$).

4. The battery control system according to claim 1,
wherein the control device is connected to the relay via a different communication line,
wherein the battery information processing unit of the relay transmits the battery information and the battery information acquisition time received from each of the plurality of battery modules to the control device, and
wherein the control device includes:
  a battery information managing unit that collects the battery information and the battery information acquisition time from the relay, and
  a display processing unit that displays the collected battery information and battery information acquisition time on a display unit.

5. The battery control system according to claim 1,
wherein the reference battery information acquisition time is the battery information acquisition time that is earliest among all received battery information acquisition times.

6. A battery control method of a battery control system which includes a plurality of battery modules, each battery module configured to acquire battery information of a battery respective to that battery module including at least a voltage of the battery and a relay that is connected to each of the plurality of battery modules via one or more communication lines and the relay configured to control the plurality of battery modules connected to the relay,
wherein the relay executes the following steps:
receiving, from a control device, measurement instruction information requesting acquisition of the battery information and transmitting the measurement instruction information to each battery module connected to the relay;
receiving the battery information and a battery information acquisition time from each battery module, wherein the battery information acquisition time is a measurement of time from a measurement starting time for acquiring the battery information to when the battery information is acquired by the battery module from the battery respective to that battery module; and acquiring the battery information acquisition time for each battery module, determining a reference battery information acquisition time, wherein the reference battery information acquisition time is the battery information acquisition time that is latest among all received battery information acquisition times, calculating measurement time differential information ($\Delta t$), wherein the measurement time differential information ($\Delta t$) includes, for each battery module other than the batter module associated with the reference battery information acquisition time, a time difference value between the reference battery information acquisition time and the battery information acquisition time of the respective battery module, and transmitting the calculated measurement time differential information ($\Delta t$) associated with each battery module to each respective battery module, and wherein the battery module executes the following steps:
measuring the battery information acquisition time for the battery module to acquire the battery information from the battery;
measuring and acquiring the battery information of the battery when the measurement instruction information is received from the relay, acquiring the battery information acquisition time, and transmitting the battery information and the battery information acquisition time to the relay; and
receiving the measurement time differential information ($\Delta t$) from the relay, storing the received measurement time differential information ($\Delta t$) in a storage unit, and when the measurement instruction information is received, correcting the measurement starting time for measuring the battery information by delaying the measurement starting time by the measurement time differential information ($\Delta t$) stored in the storage unit so that each of the plurality of the battery modules acquires the respective battery information at a same time.

7. The battery control system according to claim 6,
wherein the reference battery information acquisition time is the battery information acquisition time that is earliest among all received battery information acquisition times.

8. The battery control system according to claim 4, wherein the relay and the plurality of the battery modules are included in a battery pack, and the battery pack is connected to the control device.

9. The battery control system according to claim 8, further comprising a plurality of additional battery packs having respective relays and pluralities of battery modules, and the plurality of the additional battery packs are connected to the control device.

* * * * *